(12) United States Patent
Watanabe et al.

(10) Patent No.: US 9,515,231 B2
(45) Date of Patent: Dec. 6, 2016

(54) PHOSPHOR AND LIGHT EMITTING DEVICE USING THE SAME

(71) Applicant: NICHIA CORPORATION, Anan-shi (JP)

(72) Inventors: Hiroyuki Watanabe, Itano-gun (JP); Shoji Hosokawa, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/608,191

(22) Filed: Jan. 29, 2015

(65) Prior Publication Data
US 2015/0214444 A1 Jul. 30, 2015

(30) Foreign Application Priority Data

Jan. 29, 2014 (JP) .................................. 2014-014958
Jan. 26, 2015 (JP) .................................. 2015-012038

(51) Int. Cl.
H01L 33/00 (2010.01)
H01L 31/00 (2006.01)
(Continued)

(52) U.S. Cl.
CPC ......... *H01L 33/502* (2013.01); *C09K 11/7734* (2013.01); *C09K 11/7774* (2013.01); *H01L 2224/32245* (2013.01); *H01L 2224/48091* (2013.01); *H01L 2224/48247* (2013.01); *H01L 2224/48257* (2013.01); *H01L 2224/73265* (2013.01); *Y10T 428/2982* (2015.01)

(58) Field of Classification Search
CPC ...... H01L 33/502; H01L 33/507; H01L 33/50; H01L 2224/32245; H01L 2224/48091; H01L 2224/48247; H01L 2224/48257; H01L 2224/73265; C09K 11/77; C09K 11/7734; C09K 11/7774; Y10T 428/2982
USPC ............ 257/88, 98, 26, 59, 81, 79, E33.061, 100,257/72; 252/301.4 F; 313/503, 485; 438/27, 402
See application file for complete search history.

(56) References Cited

U.S. PATENT DOCUMENTS 5,140,163 A * 8/1992 Tecotzky ........... C09K 11/7721
250/484.4
5,998,925 A 12/1999 Shimizu et al.
(Continued)

FOREIGN PATENT DOCUMENTS

JP 3503139 B2 3/2004
JP 2006-008721 1/2006
(Continued)

OTHER PUBLICATIONS

Watanabe et al., "Synthetic Method and Luminescence Properties of $Sr_xCa_{1-x}AlSiN_3$: $Eu^{2+}$Mixed Nitride Phosphors", Journal of the Electrochemical Society. 2008, 155 (3), F31-F36.

*Primary Examiner* — Dzung Tran
(74) *Attorney, Agent, or Firm* — Mori & Ward, LLP

(57) ABSTRACT

A phosphor for absorbing light in a region from ultraviolet to visible light and emitting light whose emission peak wavelength being in a range of 600 nm to 650 nm, represented by general formula shown below, and having a difference between the emission peak wavelength and a half width being larger than 543 nm.

$Sr_tCa_vEu_wAl_xSi_yN_z$ (in which, $0.5 \le t < 1$, $0 < v \le 0.5$, $0.01 < w \le 0.03$, $t+v+w<1$, $0.90 \le x \le 1.1$, $0.90 \le y \le 1.1$, $2.5 \le z \le 3.5$)

10 Claims, 14 Drawing Sheets

(51) Int. Cl.
  *H01L 29/04* (2006.01)
  *H01L 27/15* (2006.01)
  *H01L 33/50* (2010.01)
  *C09K 11/77* (2006.01)

(56) References Cited

U.S. PATENT DOCUMENTS

| | | | |
|---|---|---|---|
| 8,409,470 B2 | 4/2013 | Hirosaki et al. | |
| 2006/0083694 A1* | 4/2006 | Kodas | B01J 13/0043 424/46 |
| 2006/0255710 A1* | 11/2006 | Mueller-Mach | C04B 35/581 313/485 |
| 2007/0007494 A1 | 1/2007 | Hirosaki et al. | |
| 2009/0134359 A1 | 5/2009 | Watanabe | |
| 2009/0134775 A1* | 5/2009 | Watanabe | C04B 35/581 313/503 |
| 2009/0322209 A1 | 12/2009 | Becker et al. | |
| 2011/0279017 A1* | 11/2011 | Li | C09K 11/0883 313/503 |
| 2012/0062105 A1* | 3/2012 | Li | C09K 11/0883 313/503 |
| 2012/0305958 A1* | 12/2012 | Seibel, II | C09K 11/0883 257/98 |
| 2013/0193836 A1* | 8/2013 | Seibel, II | C09K 11/0883 252/301.4 F |
| 2013/0257266 A1 | 10/2013 | Ishizaki | |

FOREIGN PATENT DOCUMENTS

| | | |
|---|---|---|
| JP | 3837588 B2 | 1/2006 |
| JP | 2006-307182 | 11/2006 |
| JP | 2007-262574 | 10/2007 |
| JP | 2009-545660 | 12/2009 |
| JP | 2012-569364 | 4/2012 |
| JP | 2012-124356 | 6/2012 |
| JP | 2012-207228 | 10/2012 |
| WO | WO 2010/056619 | 5/2010 |

* cited by examiner

PHOSPHOR AND LIGHT EMITTING DEVICE USING THE SAME

BACKGROUND

1. Technical Field

The present disclosure relates to a phosphor and a light emitting device using the same.

2. Background Art

There have been developed light emitting devices that can emit light of various hues, by using combinations of a light source and a phosphor which can be excited by light from the light source to emit light of different hue than that of the light source, based on the principle of light-color mixing. For example, primary light in a short wavelength region corresponding to ultraviolet light to visible light is emitted from a light emitting element and with the emitted light, a phosphor is excited. As a result, at least a portion of primary light is wavelength-converted, and red, blue, green, or the like, a light of desired color can be obtained. Further, a mixed color light of white light can be emitted by mixing those colors of light.

Light emitting devices employing a light emitting diode (hereinafter may be referred to as an "LED") are used in a number of areas such as a signal light, a mobile phone, various illumination, an in-vehicle display device, and various display devices. Particularly, a light emitting device constituted with a combination of an LED and a phosphor has been actively applied to a backlight for a liquid crystal display, a small-type stroboscope, or the like. Recently, applications to lighting devices have been developed, and with utilizing advantageous properties such as long operational life and free of mercury, and such lighting devices are expected as environmentally-conscious light sources which can be replaced with fluorescent lamps.

Examples of the structure of the light emitting device include a combination of a blue LED and a yellow phosphor (for example, see JP 3503139 B). The light emitting device is configured to emit a mixed color light of white light, which is obtained by mixing blue light from the LED and yellow light which is a wavelength-converted light of a portion of blue light from the LED converted by a yellow phosphor into yellow light. For this purpose, the phosphor used in the light emitting device is required to have properties that allow for being efficiently excited by blue light of wavelength of 420 nm to 470 nm emitted from the LED and emitting yellow light.

Examples of such yellow phosphor include cerium-activated yttrium aluminum garnet-based phosphors. The examples also include phosphors obtained from such yellow phosphors by substituting portion of Y with Lu, Tb, Gd, or the like, or portion of Al with Ga or the like. The cerium-activated yttrium aluminum garnet-based phosphors can be represented by a general formula $(Y, Lu, Tb, Gd)_3(Al, Ga)_5O_{12}:Ce$, which allows for wide wavelength adjustment by adjusting the composition.

In the case of employing a typical light emitting device in which the yellow phosphor and a blue LED are used in combination, for the backlight of liquid crystal displays or for lighting devices, green component (480 to 530 nm) and red component (600 nm or greater) may be insufficient, so that an improvement in the color reproduction range and/or an improvement in the color rendering properties are required. The color reproduction range of a liquid crystal display device and the color rendering properties of a lighting device can be improved by combining a phosphor to emit light of short wavelength in a blue-green color, a green color, or a yellow-green color, and a phosphor to emit light of long wavelength in an orange color or a red color, in place of the yellow phosphor, or in addition to the yellow phosphor.

Examples of known such phosphors include a silicate phosphor, a phosphate phosphor, an aluminate phosphor, a borate phosphor, a sulfide phosphor, and an oxysulfide phosphor. Further, there have been proposed as an alternative to these phosphors, that are phosphors with less deterioration in the luminance even under high energy excitation, such as a sialon phosphor, an oxynitride phosphor, and a nitride phosphor, whose host crystals are an inorganic crystal which contains nitrogen in its crystal structure.

Of those phosphors, as an example of nitride phosphors, a red phosphor which has $CaAlSiN_3$ as a host crystal activated with $Eu^{2+}$ (hereinafter may be referred to as a "CASN phosphor") has been known (for example, see JP 3837588B). The use of a CASN phosphor has an effect for improving the color rendering properties of the light emitting device. Further, there has been known a phosphor (Sr, Ca) $AlSiN_3:Eu$ (hereinafter may be called as a "SCASN phosphor") in which a part of Ca in $CaAlSiN_3:Eu$ is substituted with Sr to increase the luminous flux of the light emitting device, in which, the more the content of Sr, the shorter the wavelength will be. (For example, see JP 2006-8721A.)

The emission peak wavelength of the CASN phosphors may be about 650 nm and the SCASN phosphors exhibit an emission at 610 nm to 650 nm which is in a shorter wavelength than the CASN phosphors. With the use of a red phosphor to emit light of a short wavelength, a light emitting device of higher brightness due to visibility can be obtained, while increasing the red light component. Thus, the SCASN phosphor is very promising red phosphor.

The SCASN phosphor can be manufactured through the operations summarized as below. The powder of raw materials of calcium nitride ($Ca_3N_2$), strontium nitride ($Sr_3N_2$), silicon nitride ($Si_3N_4$), aluminum nitride (AlN), and europium nitride (EuN) are mixed at a rate of Ca:Sr:Al:Si:Eu=0.1984:0.7936:1:1:0.008 in a glove box in a nitrogen atmosphere. The mixture is sieved through a 500 μm sieve to naturally fall into and fill a boron nitride crucible. Then the crucible is placed in a graphite resistance heating-type electric furnace and is subjected to sintering by using a gas-pressure sintering method at a temperature of 1800° C. for 2 hours in nitrogen gas of 1 MPa, thus a SCASN phosphor is manufactured.

However this synthesis method was found to produce a phosphor with low characteristics that exhibits the emission intensity of about 80% with respect to a CASN phosphor. This was caused by that with this synthesis condition, a stable CASN phosphor can be obtained but a SCASN phosphor cannot be stably exist and is gradually decomposed into different compounds ($Sr_2SiN_5$, AlN, or the like), so that a substantially pure SCASN phosphor was not able to be produced. Accordingly, methods for improving the characteristics have been studied.

For this purpose, a method have been proposed in which, without using calcium nitride or silicon nitride or aluminum nitride, metals such as calcium, strontium, silicon, aluminum, and europium are alloyed, and the powder obtained by pulverizing the alloy is nitride.

For example, see JP 2006-307182A.

Also see H. Watanabe, et al. "Synthetic Method and Luminescence Properties of $Sr_xCa_{1-x}AlSiN_3:Eu^{2+}$ Mixed Nitride Phosphors" Journal of The Electrochemical Society, 155 (3) F31-F36 (2008).

However, any phosphors and the method of manufacturing those phosphors described above regard merely a synthesis and emission luminance of a SCASN phosphor, and the control of the shape of the emission spectrum by finely controlling the chemical composition has not been examined. Also, the SCASN phosphors are used to increase the red light component of the light emitting device to improve the color reproduction range and color rendering properties. Along with a requirement for further improvement in the luminous flux of the light emitting device, a higher luminance is also required to the SCASN phosphors.

The present invention is devised to solve the problems described above. That is, one object of the present disclosure is to provide phosphors in which the visibility component is increased to improve luminance of the SCASN phosphors.

SUMMARY

Vigorously conducting research and development in consideration of the above problems, the inventors have found that adjusting nitride-based raw material which constitutes the phosphor to a specific composition ratio allows adjusting the half value width of the emission spectrum and further allows adjusting the peak wavelength.

A phosphor according to an embodiment is for absorbing light in a region from ultraviolet to visible light and emitting light whose emission peak wavelength being in a range of 600 nm to 650 nm, represented by general formula shown below, and having a difference between the emission peak wavelength and a half width being larger than 543 nm.

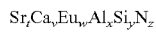
$Sr_tCa_vEu_wAl_xSi_yN_z$ (in which, $0.5 \leq t < 1$, $0 < v \leq 0.5$, $0.01 < w \leq 0.03$, $t+v+w<1$, $0.90 \leq x \leq 1.1$, $0.90 \leq y \leq 1.1$, $2.5 \leq z \leq 3.5$)

A phosphor according to an embodiment of the present invention is excited by light in the ultraviolet to blue wavelength range and emits light in a yellow to red wavelength range with a narrow half width. Thus, higher luminance of the phosphor can be obtained and a light emitting device which includes the phosphor can attain higher luminous flux with lesser reduction in color rendering properties.

DETAILED DESCRIPTION OF THE EMBODIMENTS

Figure 1:
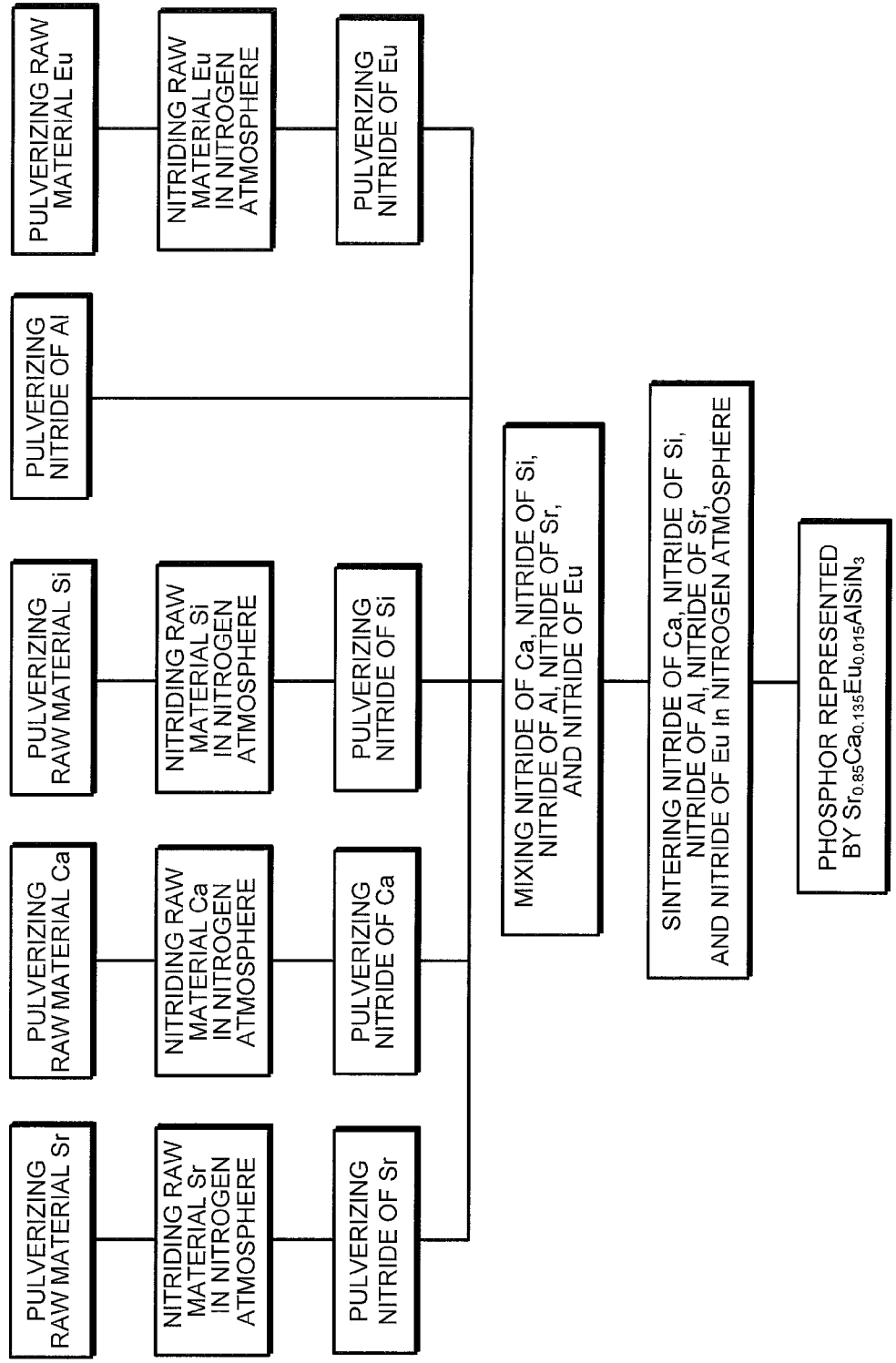
FIG. 1 is a flowchart illustrating an example of a method of manufacturing a phosphor according to the present embodiment.

The embodiments according to the present disclosure will be described below with reference to the drawings. The preferred embodiments are intended as illustrative of a phosphor and a light emitting device using the same, and a method of manufacturing the phosphor to give a concrete form to technical ideas of the present invention, and the scope of the invention is not limited to those described below. Further, the members shown in claims attached hereto are not specifically limited to members in the embodiments.

In the present specification, the range from near-ultraviolet light to short wavelength visible light corresponds to a region in the vicinity of 240 nm to about 500 nm. The excitation light source with the emission peak wavelength of 240 nm to 480 nm can be used. Of those, the excitation light source with the emission peak wavelength of 360 nm to 470 nm can be preferably used. Particularly, an excitation light source of 380 nm to 420 nm or 450 nm to 470 nm which is used for a semiconductor light emitting element is preferably used. With the use of a semiconductor light emitting element as an excitation light source, a light emitting device which has high linearity of outputting to inputting in high efficiency and exhibits high stability to mechanical impacts can be obtained.

In the specification, the relation between the color names and the chromaticity coordinates, the relation between the range of wavelength of light and the color name of single color light, and the like conform to JIS Z8110. More specifically, the wavelengths of 380 nm to 410 nm correspond to purple light, 410 nm to 455 nm correspond to blue purple light, 455 nm to 485 nm correspond to blue light, 485 nm to 495 nm correspond to blue green light, 495 nm to 548 nm correspond to green light, 548 nm to 573 nm correspond to yellow green light, 573 nm to 584 nm correspond to yellow light, 584 nm to 610 nm correspond to yellow red light, and 610 nm to 780 nm correspond to red light.

(Phosphor)

A phosphor according to an embodiment of the present disclosure is activated with europium and absorbs light in the near-ultraviolet to blue region and emits light of yellow to red region.

The phosphor is represented by general formula: $Sr_{t-v}Ca_vEu_wAl_xSi_yN_z$ (in which, $0.5 \leq t<1$, $0<v\leq 0.5$, $0.01<w\leq 0.03$, $t+v+w<1$, $0.90\leq y\leq 1.1$, $2.5\leq z\leq 3.5$).

The phosphor according to an embodiment of the present disclosure absorbs light in a range from ultraviolet to short-wavelength region of visible light and has an emission peak wavelength at loner wavelength side than the emission peak wavelength of the excitation light. The visible light of a short wavelength region is mainly in the blue light-region. More specifically, the phosphor is excited by light from the excitation light source which has an emission peak wavelength in 250 nm to 500 nm and emits fluorescent light which has an emission peak wavelength in a wavelength range of 600 to 650 nm. This is because with the use of an excitation light source of the wavelength range as described above, a phosphor with a high light emitting efficiency can be provided. Particularly, an excitation light source which has a main emission peak wavelength at 250 nm to 420 nm or at 420 nm to 500 nm is preferably used, and further, an excitation light source which has a main emission peak wavelength at 420 nm to 480 nm is preferably used.

The phosphor according to an embodiment of the present disclosure has a difference between the emission peak wavelength and a half width being larger than 543 nm. The difference between the emission peak wavelength and a half width is preferably smaller than 640 nm. This arrangement allows for narrowing of the half width of the emission spectrum in yellow to red emission region which allows an increase in the emission luminance of the phosphor. The expression "difference between the emission peak wavelength and a half width" is defined as "wavelength index" and described in the present specification.

It is preferable that the nitride phosphor includes a crystal structure at least partially. For example, glass body (amorphous) does not have a definite structure, so that unless strictly controlling the reaction conditions in the processes of manufacturing to be precisely uniform, a uniform component ratio in the phosphor cannot be obtained, resulting in uneven chromaticity. On the other hand, the phosphor according to the present embodiment is not a glass body but is powder to particle which has a crystallinity, which is easily manufactured and processed. In addition, the phosphor can be dissolved uniformly in an organic solvent, which facilitates preparation of a luminescent plastic, a polymer thin film material, and so forth. More specifically, the phosphors according to the present embodiment include at least 50 weight percent, more preferably 80 weight percent or more of crystal. The above indicates the ratio of a luminescent crystal phase. With 50 weight percent or more of the crystal phase, luminescence for practical use can be obtained, and thus preferable. Thus, the more the crystal phase, the better. Accordingly, higher emission luminance can be achieved while facilitating processability.

A phosphor according to an embodiment of the present disclosure has europium (Eu), which is a rare earth element, as its light emission center. The light emission center is not limited only to europium, a part of europium may be substituted with one or more rare earth metals or alkaline earth metals, and the phosphor may be co-activated with Eu and the one or more substitution elements. $Eu^{2+}$ which is a bivalent rare earth ion can be stably present with an appropriate host, and can exhibit a light emitting effect.

(Raw Materials for Phosphor)

The phosphor according to the present embodiment can be manufactured by wet or dry mixing various raw materials of the phosphor. For the raw material of the phosphor, Sr, Ca, Si, Al, and Eu may be added in elements or in various compounds according to the need. The respective raw materials will be described below.

Of the Sr in the phosphor composition, an elemental Sr as well as Sr partially substituted with Ca, Mg, Ba, or the like, can be used. In a similar manner as in Sr, of the Ca in the phosphor composition, an elemental Ca as well as Ca partially substituted with Sr, Mg, Ba, or the like, can be used. Accordingly, the peak in the emission wavelength of the nitride phosphor can be adjusted. A nitride, a hydride, or the like of Sr may be used. Similarly, a nitride, a hydride, or the like of Ca may be used. More specifically, $Ca_3N_2$, $CaH_2$, $Sr_3N_2$, $SrN$, $Sr_2N$, $SrH_2$, or the like, can be used.

For the Ca in the phosphor composition, an elementary substance is preferably used, but a compound such as an imide compound, an amide compound, or the like, can also be used. The Ca raw material which contains Li, Na, K, B, Al, or the like can be used. Refined raw materials are preferably used. This can eliminate a refining operation, so that the manufacturing processes of the phosphor can be simplified and accordingly a less expensive nitride phosphor can be provided. The Ca raw material is pulverized in an argon atmosphere in a glove box. The pulverizing of Ca raw material is preferably conducted so that the average particle size is in a range of about 0.1 μm to 15 μm, in view of the reactivity with other raw materials, the control of the particle size during and after calcination, but it is not limited to this range. The purity of Ca is preferably 2N or higher, but is not limited thereto.

Si which is a composition of the phosphor is preferably singly used, but a portion of Si can be substituted with the group-IV elements Ge, Sn, Ti, Zr, and Hf. A nitride phosphor with good crystallinity can be obtained inexpensively with only using Si. A nitride, an oxide, or the like of Si may be used. More specifically, $Si_3N_4$, $SiO_2$ can be used.

Al which is a composition of the phosphor is also preferably singly used, but a portion of Al can be substituted with the group-III elements Ga and In, V, Cr, and Co. A nitride phosphor with good crystallinity can be obtained inexpensively with only using Al. A nitride of Al or an oxide of Al may also be used. Refined those raw materials are preferably used, but commercially available raw materials can also be used. More specifically, aluminum nitride AlN as a nitride of Al and aluminum oxide $Al_2O_3$ as an oxide of Al can be used.

Eu, which is an activator, is preferably used singly, but a portion of Eu may be substituted with Sc, Y, La, Ce, Pr, Nd, Sm, Gd, Tb, Dy, Ho, Er, Tm, Yb, or Lu. The other elements substituted with a portion of Eu serves as co-activators. Employing co-activation allows for changing in the color tone, so that adjustment of the luminous characteristic can be performed. In the case of using a mixture containing essentially Eu, the compounding ratio can be changed as desired. Europium mainly has divalent and trivalent energy levels, but in a nitride phosphor, $Eu^{2+}$ is used as the activator with respect to the host, for example Sr.

Also, a compound of Eu can be used as the raw material. Refined those raw materials are preferably used, but commercially available raw materials can also be used. More specifically, europium oxide $Eu_2O_3$, europium metal, europium nitride, or the like, can also be used. Europium oxide of high purity is preferable, but commercially available europium oxide can also be used. The phosphor according to an embodiment of the present disclosure employs divalent Eu for its emission center, but the divalent Eu is susceptible to oxidation, so that generally it is commercially available in the composition of trivalent $Eu_2O_3$.

The elements which are further added when needed are generally used in an oxide or hydroxide form, but are not limited thereto, a metal, a nitride, an imide, an amide, or other inorganic salts may be used and also in a state of being prepared in other raw materials.

Also, oxygen may be contained in the composition of the nitride phosphor according to an embodiment of the present disclosure. Oxygen is included in the various oxides or nitride, or contained in the metals in minute quantity, which can be used as the raw materials. It is assumed that the oxygen in the composition of the nitride phosphor is introduced from those materials, derived from the oxidation of the raw materials during calcination, or adhered to the phosphor after generation. Generally, controlling the mole ratio of oxygen in the composition can change the crystal structure of the phosphor, so that the emission peak wavelength of the phosphor can be shifted. On the other hand, in view of luminous efficiency, a smaller oxygen content in the phosphor is more preferable, and an oxygen content of 2 weight percent or less with respect to the mass of the formation phase.

(Flux)

The phosphor according to an embodiment of the present disclosure can be added with a flux such as a halide. Many nitride phosphors have high melting points, which leads little generation of liquid phase at the time of solid phase reaction, so that in many cases the reaction cannot proceed smoothly. In contrast, it is assumed that inclusion of halide allows for a reduction in the generation temperature of liquid phase and the generation of liquid phase can be facilitated, and thus, the reaction can be accelerated. Further, solid phase reaction is assumed to proceed more uniformly, leading to a phosphor with excellent luminous characteristics. For the halide, a chloride, a fluoride, or the like of a rare earth element, an alkaline earth element, or an alkaline earth metal can be used.

Further, an effect similar to that of a flux can be obtained with an addition of boron. A boron compound is a substance which has a high thermal conductivity, so that addition thereof to the raw material allows for uniform temperature distribution in the raw material during calcination, which can facilitate solid phase reaction, leading to an improvement in the luminous characteristics. The addition can be performed by adding at the time of mixing the raw materials.

Examples of the boron raw material of the phosphor include boron, a boride, a boron nitride, a boron oxide, and a borate salt. Specific examples of boron to be added to the raw materials of the phosphor include, B, BN, $H_3BO_3$, $B_2O_3$, $BCl_3$, $SiB_6$, and $CaB_6$. Such a boron compound can be added to the raw materials in a predetermined amount.

(Method of Manufacturing Phosphor)

Next, as an example of phosphors according to the present disclosure, among the nitride phosphors represented by general formula $Sr_tCa_vEu_wAl_xSi_yN_z$ ($0.5 \leq t < 1$, $0 < v \leq 0.5$, $0.01 < w \leq 0.03$, $t+v+w<1$, $0.90 \leq x \leq 1.1$, $0.90 \leq y \leq 1.1$, $2.5 \leq z \leq 3.5$), a nitride phosphor whose composition is represented by $Sr_{0.86}Ca_{0.135}Eu_{0.015}AlSiN_3$ is illustrated and a method of manufacturing thereof will be described below. However, the method of manufacturing the nitride phosphor and the composition thereof is not limited thereto.

FIG. 1 is a flowchart illustrating an example of a method of manufacturing a phosphor according to the present embodiment. First, a Ca raw material is pulverized.

Next, the Ca raw material is nitrided in a nitrogen atmosphere. That is, a nitride of Ca can be obtained by nitriding the Ca raw material in a nitriding atmosphere, at 600° C. to 900° C. for about 5 hours. The nitride of Ca of high purity is preferable. The reaction formula is shown in Reaction Formula 1.

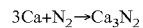  Reaction Formula 1

Further, the Ca raw material is pulverized in an argon atmosphere or in a nitrogen atmosphere in a glove box.

In a similar manner as in Ca, the Sr raw material is nitrided in a nitrogen atmosphere. The nitriding is performed at 600° C. to 900° C., and the reaction formula is shown in Reaction Formula 2. Different from that for Ca, for Sr, the amount of nitrogen can be changed according to the conditions.

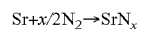  Reaction Formula 2

Meanwhile, a Si raw material is pulverized. For the Si raw material, an elementary substance is preferably used, but a nirtide compound, an imide compound, an amide compound, or the like, can also be used. Examples thereof include $Si_3N_4$, $Si(NH_2)_2$, and $Mg_2Si$. The purity of the Si raw material is preferably 3N or higher, but different elements such as Li, Na, K, B, Al, Cu, or the like may be contained. In a similar manner as in the Ca raw material, in an argon atmosphere or in a nitrogen atmosphere, the Si raw material is also pulverized in a glove box. The average particle size of the Si compound is preferably in a range of about 0.1 μm or more to about 15 μm or less, in view of the reactivity with other raw materials, the control of the particle size in and after calcination, but it is not limited thereto.

Next, the Si raw material is nitrided in a nitrogen atmosphere. More specifically, in a nitrogen atmosphere, nitriding silicon Si at 800° C. to 2000° C. for about 5 hours to obtain silicon nitride. The silicon nitride used in an embodiment of the present disclosure preferably has high purity. The reaction formula is shown in Reaction Formula 3.

  Reaction Formula 3

In a similar manner, in a nitrogen atmosphere, the nitride of Si is pulverized to 0.1 μm to 10 μm in a glove box.

Meanwhile, AlN is synthesized by performing a direct nitriding method on Al. AlN which is a nitride of Al and $Eu_2O_3$ which is a compound of Eu are pulverized. The average particle size thereof is preferably in a range of about 0.1 μm to about 15 μm, more preferably about 0.1 μm to about 10 μm, in view of the reactivity with other raw materials, the control of the particle size in and after calcination, but it is not limited thereto. But commercially available AlN powder can also be used. With this, the manufacturing processes can be simplified.

Similar processing is performed on Eu. The Eu raw material can be an elementary substance but may contain other rear earth elements. The Eu raw material is pulverized and is nitrided to synthesize EuN. Nitriding can be performed in a nitrogen atmosphere or in an ammonia atmosphere, at 600° C. to 1200° C. In a nitrogen atmosphere or in an argon atmosphere, the nitride of Eu is pulverized to about 0.1 μm to about 10 μm in a glove box.

After the pulverizing, for example, to obtain a composition ratio of Sr:Ca:Eu:Al:Si=0.85:0.135:0.015:1.0:1.0, the nitride of Sr, the nitride of Ca, the nitride of Si, the nitride of Al, and the nitride of Eu, and as needed a predetermined amount of a compound of an additional element are mixed. The mixing can be performed by dry mixing. The present embodiment is not limited to the composition ratio.

The mixture described above is calcined in a nitrogen atmosphere. For the calcination, an electric furnace can be used. The calcination temperature can be in a range of 1200°

C. to 2200° C., but a calcination temperature of 1500° C. to 2100° C. is preferable. The calcination can be performed by two-stage calcination (multi-stage calcination) in which a first-stage calcination is performed at 800° C. to 1400° C., and the temperature is gradually increased to perform a second-stage calcination at 1500° C. to 2100° C. The calcination is preferably performed by placing the raw materials of the phosphor in a crucible or a boat made of a carbon material such as graphite, or of boron nitride (BN) material. Other than those described above, a crucible made of alumina ($Al_2O_3$) or of a Mo material can be used, but a crucible made of BN is preferable.

The reducing atmosphere may include at least one of nitrogen, hydrogen, argon, carbon dioxide, carbon monoxide, and ammonia. The calcination can be performed under a reduction atmosphere other than those described above.

By calcination, a phosphor represented by $Sr_{0.85}Ca_{0.135}Eu_{0.015}AlSiN_3$ can be obtained. An example of the reaction formula of a nitride phosphor in the calcination is shown in Reaction Formula 4.

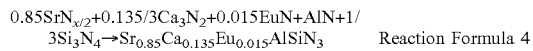

$0.85SrN_{x/2}+0.135/3Ca_3N_2+0.015EuN+AlN+1/3Si_3N_4 \rightarrow Sr_{0.85}Ca_{0.135}Eu_{0.015}AlSiN_3$    Reaction Formula 4

The composition of the phosphor is a representative composition estimated from the compounding ratio. The composition that actually synthesized may differ to some degree from the charge ratio due to inclusion of oxygen derived from raw materials or decomposition or scattering occurred during the calcination. Also, the composition of the target phosphor can be altered by altering the compounding ratio of the raw materials.

A method different from those described above can also be used. More specifically, the elemental metals are respectively measured to obtain a predetermined composition ratio, then melted to form an alloy. The alloy is pulverized, and the pulverized alloy is nitrides in an $N_2$-gas atmosphere using a gas-pressure sintering furnace or a HIP furnace to synthesize a nitride which has a target composition.

According to the methods of manufacturing described above, a target nitride phosphor can be obtained. A portion of Eu which is a rare earth element can be substituted with various rare earth elements, or in addition to Eu, other rare earth elements such as La, Ce, Gd, Tb, Dy, Ho, Er, Tm, Lu may be contained in the nitride phosphor. As described above, preferable nitride phosphors can be obtained.

Data on the luminous characteristics of the nitride phosphors described above will be shown below. It is confirmed that in the phosphor according to the present embodiment, the emission peak wavelength and the half width can be controlled, in particular, a long-wavelength component can be reduced and the half width can be reduced. Accordingly, in the light emitting device which employs the nitride phosphor, the luminous flux can be increased without compromising the color rendering properties.

(Particle Size)

The nitride phosphor preferably has a particle size in a range of 5 μm to 20 μm. A phosphor with a particle size in a range of 5 μm to 20 μm exhibits high optical absorption rate and high conversion efficiency. Incorporating such a phosphor which has a large particle size with advantageous optical characteristics in a light emitting device allows improvement in the light emitting efficiency of the light emitting device.

In the specification, a particle size is an average particle size shown as a F.S.S. No. (Fisher Sub Sieve Sizer's No.), which is determined by an air permeability method. More specifically, the value of F.S.S. No. can be obtained such that under an environment of an atmospheric temperature of 25° C. and a humidity of 70%, a sample corresponding to 1 cm³ is weighed and packed in an exclusive sample tube. A dry air is introduced at a constant pressure in the sample tube, then, a specific surface area is obtained from a difference in the pressure, and the specific surface area is converted to an average particle size. The phosphor used in the present embodiment preferably has an average particle size in a range of 5 μm to 20 μm. Also, the phosphor which has the average particle size in this range is preferably included with a high frequency. Further, a narrow particle side distribution is preferable. As described above, with the use of a phosphor which has small variation in the particle size and in the particle size distribution, a light emitting device in which color-unevenness can be further reduced and has preferable color tone can be obtained.

(Light Emitting Device)

Next, a light emitting device which employs a nitride phosphor described above will be illustrated. Examples of the light emitting devices include a luminaire and a display device such as a display device and a radar device, a backlight of liquid crystal display. A semiconductor light emitting element can be used as an excitation light source of nitride phosphor. In the specification, the term "light emitting element" is used to include not only an element for emitting visible light but also an element for emitting near-ultraviolet light or far-ultraviolet light. Further, as an excitation light source, besides the semiconductor light emitting element, a mercury lamp or the like which is used in a conventional lighting devices, an excitation light source which has an emission peak wavelength in a short wavelength range of ultraviolet to the visible light can be used appropriately.

In the present embodiment, a semiconductor light emitting device provided with a light emitting element to emit light of near-ultraviolet to short-wavelength range visible light is used as the excitation light source. A light emitting element has a small size and good power efficiency and emits light of bright color. Also, the light emitting element is a semiconductor element, so that burnout can be avoided. Further, the light emitting element exhibits superior initial drive performance and is resistant to repetitive ON/OFF operations. Accordingly, the light emitting device is preferably provided with a combination of a light emitting element and a nitride phosphor.

Also, the excitation light source is preferably a light emitting element which can emit a light of a short-wavelength region from near-ultraviolet light to visible light.

There are various types of light emitting devices equipped with a light emitting element, such as a lamp-shaped type and a surface-mounted type. In the present embodiment, a light emitting device of surface-mounted type will be described with reference to FIG. 2.

Figure 2:
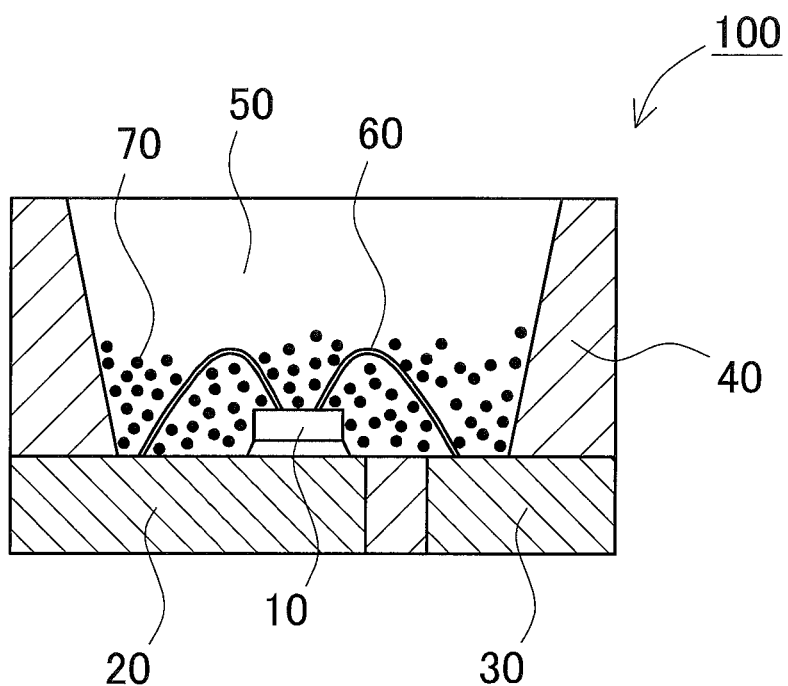
FIG. 2 is a partial cross-sectional view of a light emitting device according to the present embodiment.

FIG. 2 is a schematic diagram of a light emitting device 100 according to the present embodiment. The light emitting device 100 according to the present embodiment includes a package 40 which defines a recess, a light emitting element 10, and a sealing member 50 which covers the light emitting element 10. The light emitting element 10 is arranged in the recess formed in the package 40, and electrically connected to a pair of positive and negative lead electrodes 20, 30 which are arranged in the package 40, respectively through a conductive wire 60. The sealing member 50 is made of a resin which contains a phosphor 70 and is filled in the recess. Further, the pair of positive and negative lead electrodes 20, 30 are partially exposed on outer surfaces of the package 40. Through those lead electrodes 20, 30, the electric power is supplied from the outside and the light emitting device 100 emits light. The components which constitute the light emitting device of the second embodiment will be described below.

(Light Emitting Element 10)

The light emitting element 10 can emit light having a peak emission wavelength ranging from the ultraviolet region to the visible light region. The light emitted from the light emitting element 10 preferably has a peak wavelength in 240 nm to 520 nm, and 420 nm to 470 nm is more preferable. For the light emitting element 10, for example, a nitride semiconductor element ($In_X Al_Y Ga_{1-X-Y} N$, $0 \leq X$, $0 \leq Y$, $X+Y \leq 1$) can be used. With the use of such a nitride semiconductor light emitting element, a stable light emitting device resistant to mechanical impacts can be obtained.

(Phosphor 70)

A phosphor 70 according to the present embodiment is predominantly distributed in a portion of the sealing member 50. In this case, the sealing member 50 also serves as a wavelength converting member, in addition to serving as a member for protecting the light emitting element and the phosphor from the external environment. Arranging the phosphor close to the light emitting element 10 allows efficient wavelength conversion of light from the light emitting element 10, and a light emitting device having excellent luminous efficiency can be obtained. The relative arrangement between the member which contains the phosphor and the light emitting element is not limited to that in which the both are disposed closely. In view of thermal effect on the phosphor, the light emitting element and the wavelength converting member which contains the phosphor can be arranged spaced apart from each other. Also, in order to obtain light of even color, the phosphor 70 may be mixed in the sealing member 50 approximately uniformly.

The phosphor 70 may include two or more phosphors. For example, in the light emitting device 100 according to the present embodiment, a light emitting element 10 to emit blue light, a phosphor according to the embodiment and to be excited by the blue light, and a phosphor to emit red light are used together, to obtain a mixed-color light of white color with excellent color rendering properties can be obtained.

Also, a green phosphor and/or a blue phosphor can be used together with the above. Further addition of a phosphor to emit green light whose emission peak wavelength is slightly different from that of the phosphor according to the present embodiment, and/or a phosphor to emit blue light allows further improvement in the color reproductivity and the color rendering properties. Addition of a phosphor to absorb ultraviolet light and to emit blue light, and with the use of a light emitting element to emit ultraviolet light in place of the light emitting element to emit blue light, the color reproductivity and the color rendering properties can be improved.

Examples of the phosphor to emit green light include Ce-activated aluminate salt phosphors such as (Y, Gd, Tb, Lu)$_3$(Al, Ga)$_5$O$_{12}$:Ce; silicate phosphors such as (Ba, Sr, Ca)$_2$SiO$_4$:Eu; oxynitride phosphors such as β-sialon phosphors $Si_{6-z}Al_zO_zN_{8-z}$:Eu (0<z<4.2); chlorosilicate phosphors such as (Ca, Sr)$_8$MgSi$_4$O$_{16}$Cl$_2$:Eu; Ca$_3$Sc$_2$Si$_3$O$_{12}$:Ce, CaSc$_2$O$_4$:Ce, (Ca, Sr, Ba)$_3$Si$_6$O$_9$N$_4$:Eu, (Ca, Sr, Ba)$_3$Si$_6$O$_{12}$N$_2$:Eu, (Ca, Sr, Ba)Si$_2$O$_2$N$_2$:Eu; and Eu-activated sulfide phosphors such as SrGa$_2$S$_4$:Eu.

(Sealing Member 50)

The sealing member 50 can be formed by filling the recess defined in the light emitting device 100 with a light-transmissive resin and/or glass to cover the light emitting element 10 mounted in the recess. In view of the ease of manufacturing, a light-transmissive resin is preferable for the material of the sealing member. For the light-transmissive resin, a silicone resin composition is preferably used, but an insulating resin composition such as an epoxy resin composition or an acrylic resin composition can also be used. The phosphor 70 is contained in the sealing member 50, and further, an additional member may be appropriately contained in the sealing member 50. For example, with a light diffusion agent contained in the sealing member 50, the directivity of light from the light emitting element can be relaxed, allowing an expansion of the viewing angle.

Examples on Phosphors

As examples of the present disclosure, the nitride phosphors and light emitting devices using those were fabricated and the luminous characteristics were measured, and the results thereof will be described below.

Comparative Examples 1, 2; Examples 1 to 6

First, the phosphors of Examples 1 to 6, represented by general formula: $Sr_tCa_vEu_wAl_xSi_yN_z$ (in which, $0.5 \leq t<1$, $0<v \leq 0.5$, $0.01<w \leq 0.03$, $t+v+w<1$, $0.90 \leq x \leq 1.1$, $0.90 \leq y \leq 1.1$, $2.5 \leq z \leq 3.5$) were produced according to the method of manufacturing the phosphor described above, started from the materials weighed so that the constitutional elements satisfy the charge ratio respectively shown in Table 1. For Comparative Examples 1, 2, the materials were weighed to satisfy the charge ratio in Table 1, and respective phosphors were produced.

The composition ratio after the analysis of the phosphors of Comparative Examples 1, 2 and Examples 1 to 6 respectively obtained according to the methods described above are shown in Table 1. In the composition analysis of the phosphors, Ca, Sr, Al, and Eu were analyzed by using an ICP-AES (inductively coupled plasma emission spectrometer), Si was analyzed by performing quantitative analysis and by using an ICP-AES, and O and N were analyzed by using an oxygen-nitrogen analyzer. As shown in Table 1, although minor differences were observed in the composition, the desired phosphors were synthesized. The oxygen contents were 0.5 weight percent to 1.0 weight percent.

TABLE 1

| No. | Designed Composition (mole ratio) | | | | | Analyzed Composition (mole ratio) | | | | | | Analyzed wt % |
|---|---|---|---|---|---|---|---|---|---|---|---|---|
| | Sr | Ca | Eu | Al | Si | Sr | Ca | Eu | Al | Si | N | O |
| Comparative Example 1 | 0.8 | 0.19 | 0.01 | 1 | 1 | 0.692 | 0.219 | 0.010 | 1 | 1.05 | 2.92 | 0.77 |
| Example 1 | 0.85 | 0.135 | 0.015 | 1 | 1 | 0.775 | 0.181 | 0.015 | 1 | 1.10 | 3.13 | 0.79 |
| Example 2 | 0.91 | 0.07 | 0.02 | 1 | 1 | 0.809 | 0.112 | 0.020 | 1 | 1.04 | 3.04 | 0.91 |
| Example 3 | 0.91 | 0.065 | 0.025 | 1 | 1 | 0.801 | 0.111 | 0.025 | 1 | 1.01 | 3.04 | 0.92 |

TABLE 1-continued

| No. | Designed Composition (mole ratio) | | | | | Analyzed Composition (mole ratio) | | | | | | Analyzed wt % |
|---|---|---|---|---|---|---|---|---|---|---|---|---|
| | Sr | Ca | Eu | Al | Si | Sr | Ca | Eu | Al | Si | N | O |
| Comparative Example 2 | 0.85 | 0.14 | 0.01 | 1 | 1 | 0.748 | 0.170 | 0.010 | 1 | 1.04 | 2.97 | 0.86 |
| Example 4 | 0.91 | 0.076 | 0.014 | 1 | 1 | 0.820 | 0.107 | 0.014 | 1 | 1.03 | 3.03 | 0.78 |
| Example 5 | 0.91 | 0.075 | 0.015 | 1 | 1 | 0.816 | 0.111 | 0.015 | 1 | 1.02 | 2.98 | 0.80 |
| Example 6 | 0.93 | 0.054 | 0.016 | 1 | 1 | 0.828 | 0.089 | 0.016 | 1 | 1.01 | 2.98 | 0.81 |

The particle sizes and luminous characteristics of the phosphors of Comparative Examples 1, 2 and Examples 1 to 6 are shown in Table 2. The particle sizes were about 10 μm. The luminous characteristics according to Examples 1 to 3 show higher luminance than that of Comparative Example 1 although the energy (ENG) of each spectrum is equivalent to that of Comparative Example 1. Examples 4 to 6 also show higher luminance than that of Comparative Example 2.

TABLE 2

| No. | Particle size D | 460 nm-excitation Light Emission Properties | | | | | Wavelength Index | |
|---|---|---|---|---|---|---|---|---|
| | | x | y | Luminance (%) | ENG (a.u.) | λp (nm) | Half Width | (λp − Half Width) | Reflectance 550 nm |
| Comparative Example 1 | 10.0 | 0.633 | 0.359 | 100.0 | 100.0 | 631 | 92 | 539 | 33.6 |
| Example 1 | 10.2 | 0.638 | 0.354 | 108.7 | 102.0 | 629 | 81 | 548 | 24.1 |
| Example 2 | 10.4 | 0.638 | 0.354 | 110.2 | 98.8 | 624 | 76 | 548 | 19.9 |
| Example 3 | 10.4 | 0.641 | 0.351 | 106.8 | 99.5 | 630 | 78 | 552 | 18.7 |
| Comparative Example 2 | 9.9 | 0.633 | 0.361 | 100.0 | 100.0 | 623 | 80 | 543 | 29.5 |
| Example 4 | 10.2 | 0.632 | 0.362 | 106.9 | 102.8 | 623 | 78 | 545 | 25.6 |
| Example 5 | 10.4 | 0.635 | 0.360 | 103.5 | 102.2 | 624 | 77 | 547 | 24.0 |
| Example 6 | 10.6 | 0.633 | 0.362 | 107.8 | 103.3 | 622 | 77 | 545 | 25.5 |

(Wavelength Index)

Figure 3:
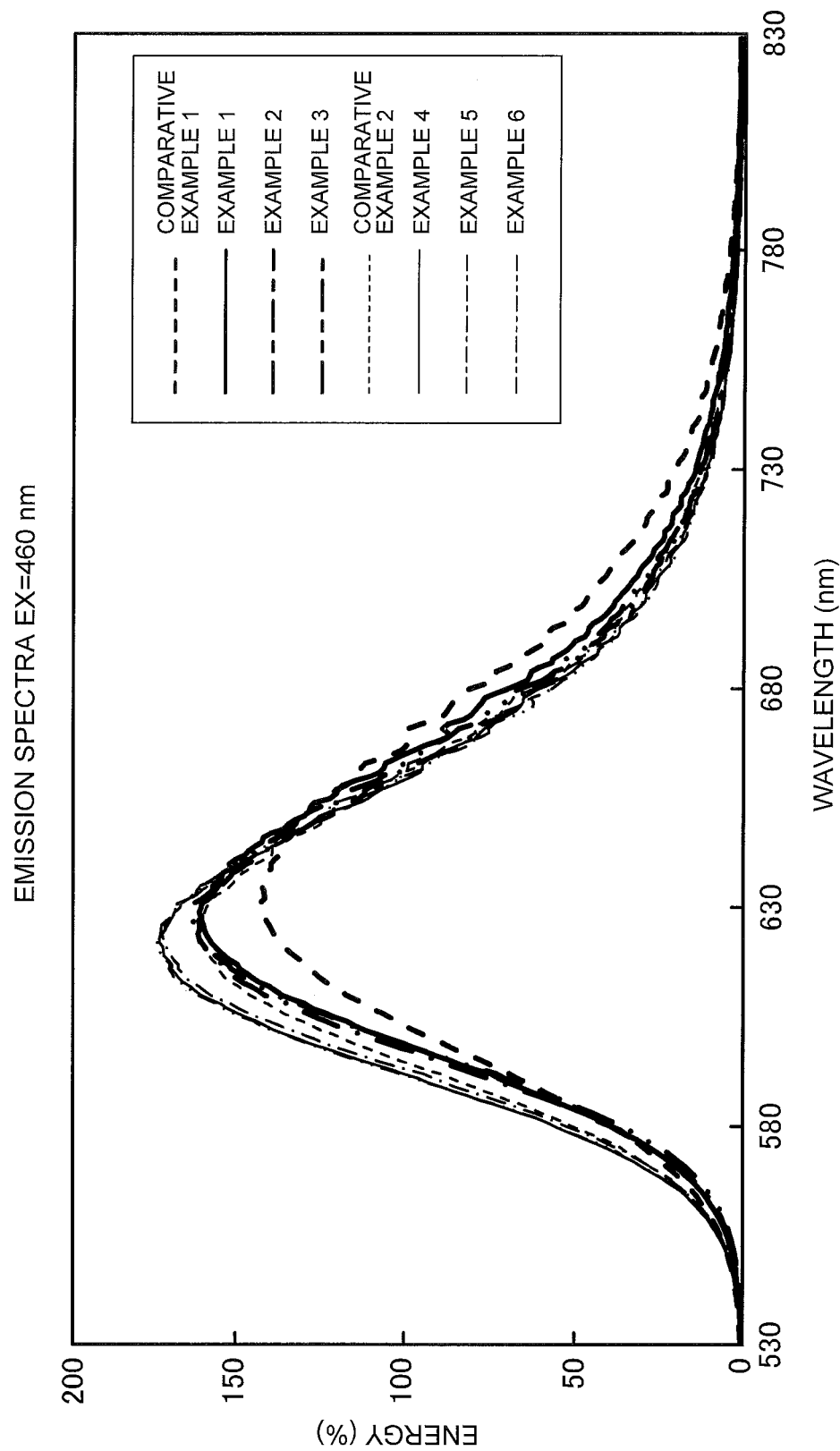
FIG. 3 is a graph showing emission spectra of phosphors according to Examples 1 to 6 and Comparative Examples 1 and 2, which are excited by an excitation light source at 460 nm.
Figure 4:
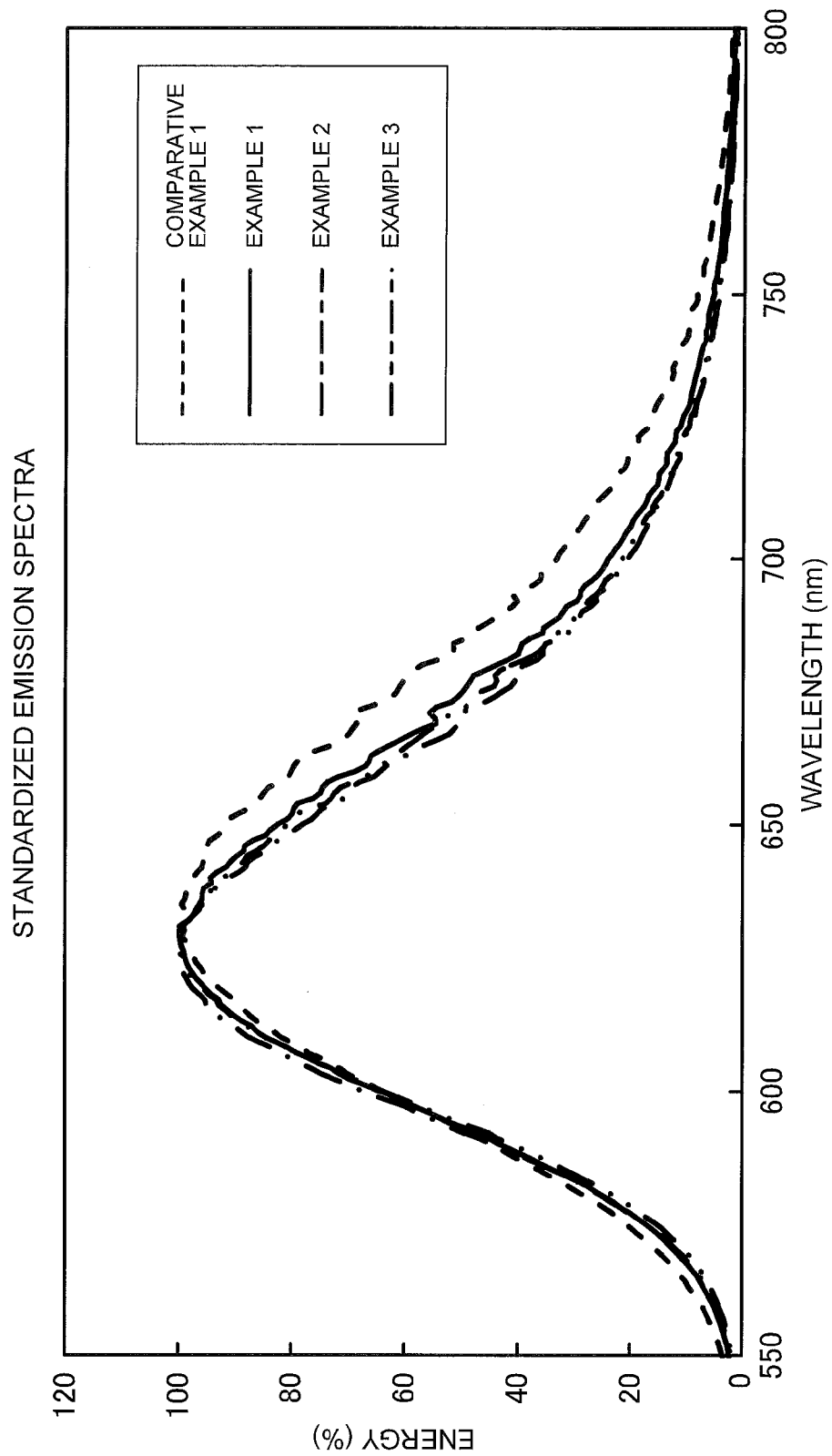
FIG. 4 is a graph showing standardized emission spectra of the phosphors according to Examples 1 to 3 and Comparative Example 1 shown in FIG. 3.
Figure 5:
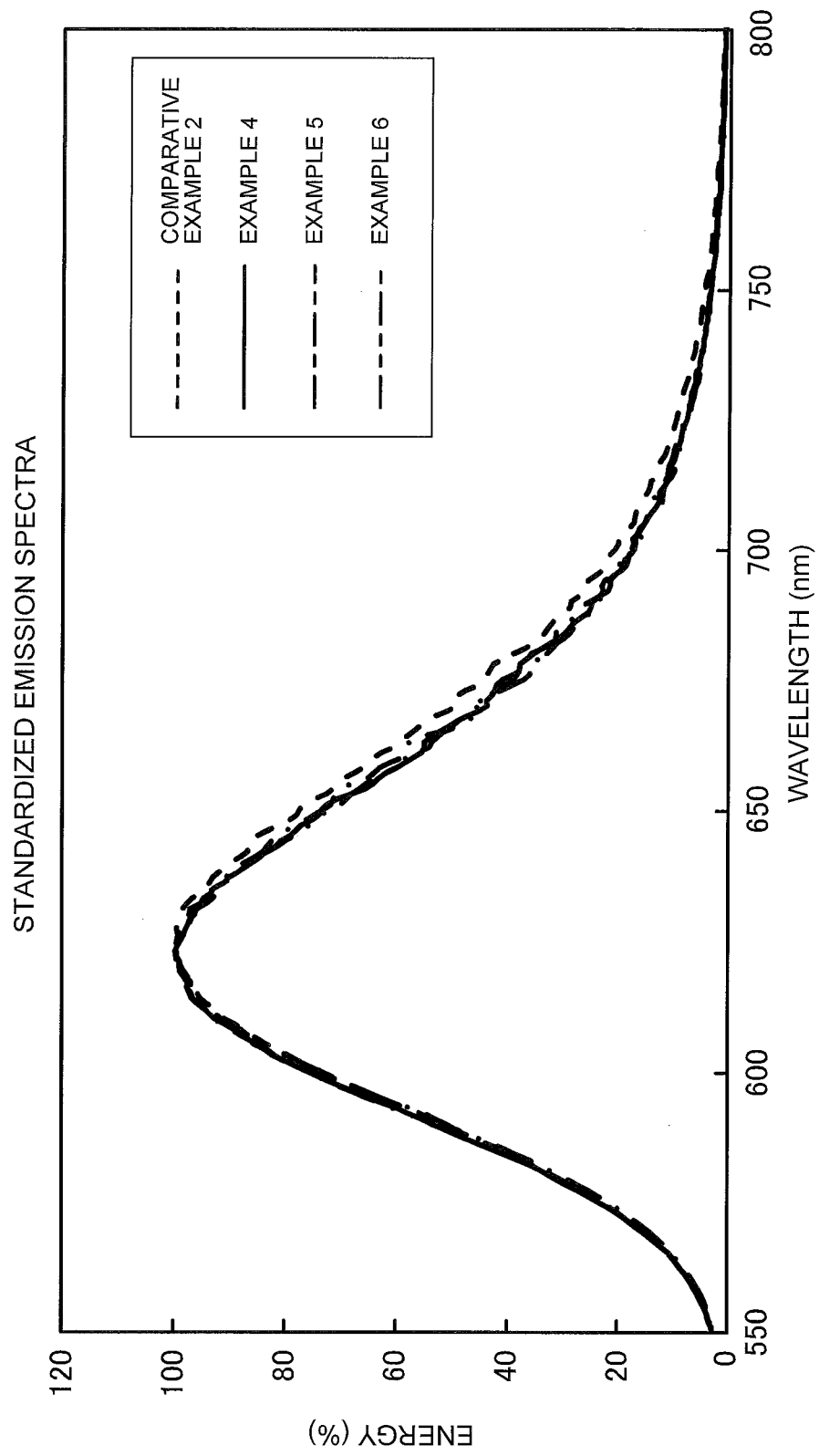
FIG. 5 is a graph showing standardized emission spectra of the phosphors according to Examples 4 to 6 and Comparative Example 2 shown in FIG. 3.

In the following, a value obtained by deducting a half value width of the emission spectrum from the emission peak wavelength (λp) is defined as "wavelength index" and examined. As shown in Table 2, in Examples 1 to 6, each wavelength index is larger than that in Comparative Examples 1, 2. That is, it is confirmed that in Examples 1 to 6, the half value width of the emission spectrum is narrower with respect to the emission peak wavelength. FIG. 3 shows emission spectra of phosphors according to Examples 1 to 6 and Comparative Examples 1 and 2, which are excited by an excitation light source at 460 nm. FIG. 4 and FIG. 5 respectively show the standardized emission spectra shown in FIG. 3. From those figures, in Examples 1 to 6, long-wavelength component is decreased, respectively, compared to that in Comparative Examples 1, 2, resulting in narrower half width.

(Reflectance)

Figure 6:
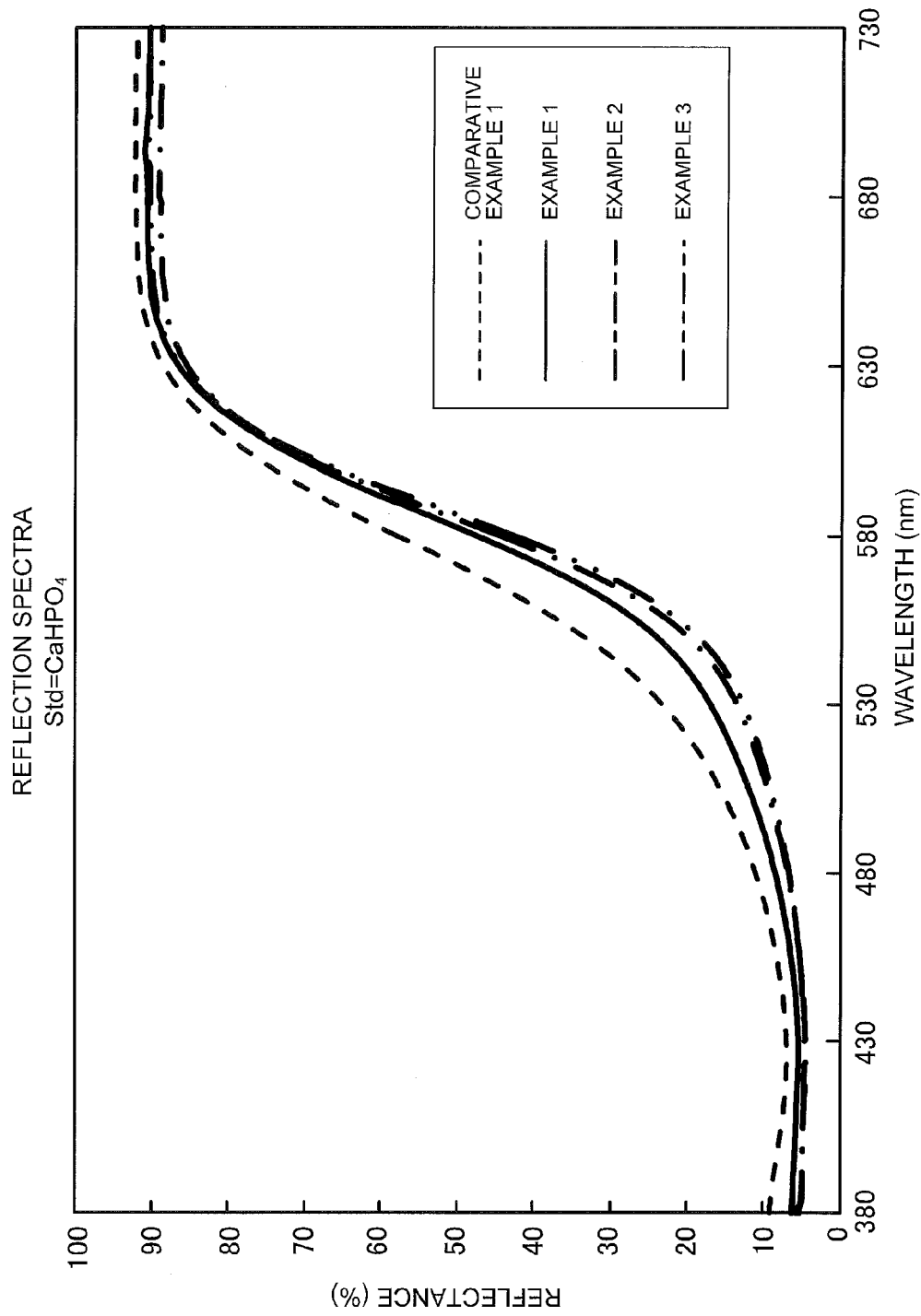
FIG. 6 is a graph showing reflection spectra of the phosphors according to Examples 1 to 3 and Comparative Example 1.
Figure 7:
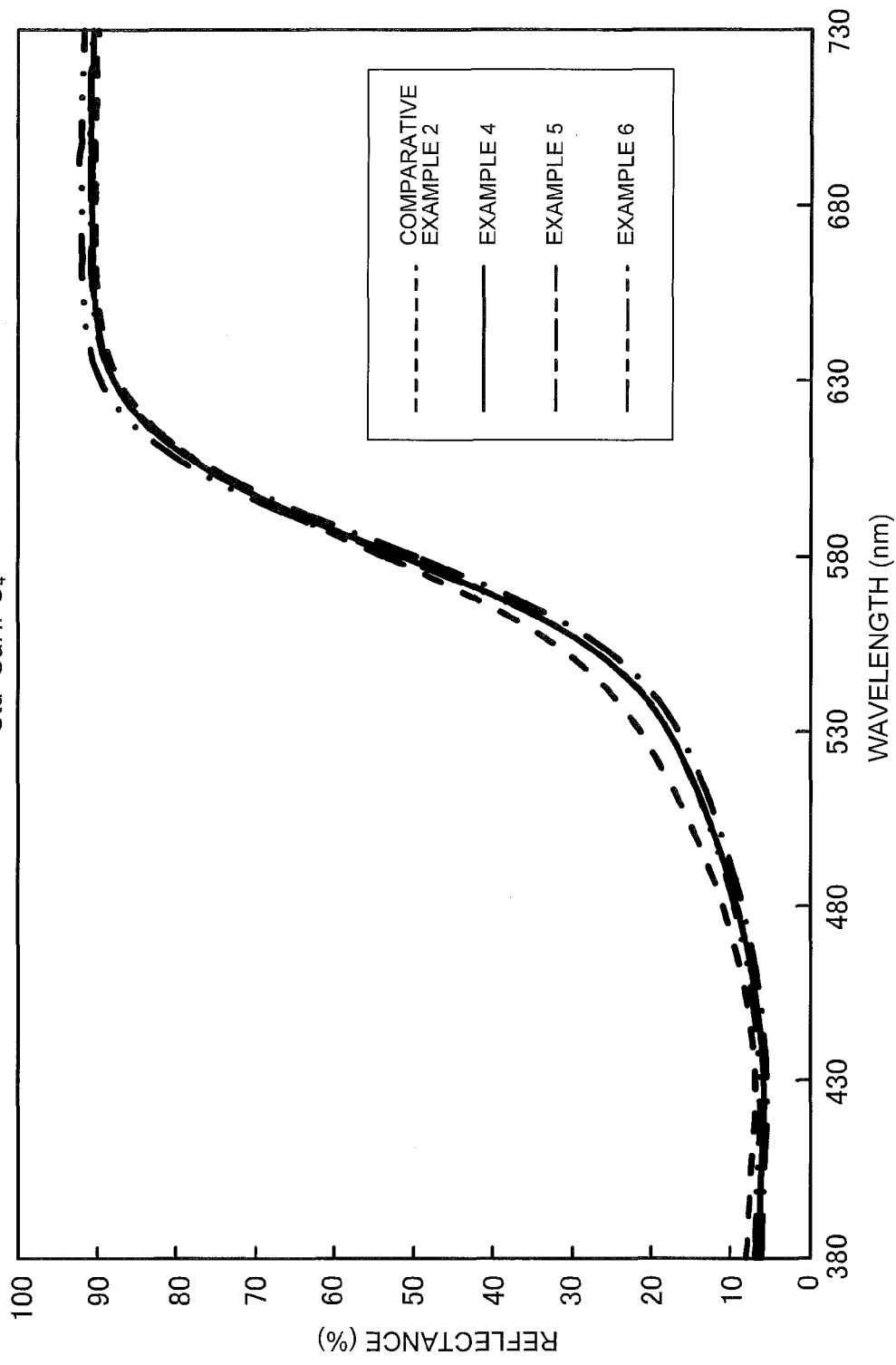
FIG. 7 is a graph showing reflection spectra of the phosphors according to Examples 4 to 6 and Comparative Example 2.

Further, the reflection spectra of the phosphors according to Examples 1 to 3, and Comparative Example 1 are shown in FIG. 6, and the reflection spectra of the phosphors according to Examples 4 to 6, and Comparative Example 2 are shown in FIG. 7, respectively. As shown in the figures, the reflectance in each example is lower than that in the corresponding comparative example. In other words, it is proved that the optical absorption rate is increased. Particularly, the reduction in the reflectance is significant at about 550 nm, which ranges about 15% to about 28%. The absorption is advantageous in that it allows for controlling of the emission component at about 550 nm when constituting the light emitting device, which leads to controlling of color rendering properties.

Examples 11-16, Comparative Examples 11-12

As described above, it can be expected that a reduction in the half value width of the emission spectrum of a SCASN phosphor can lead an increase in the luminous flux of the light emitting device which employs the phosphor. In order to confirm the above, the phosphors manufactured as described in Comparative Examples 1, 2 and Examples 1 to 6 were respectively combined with an LED which is a semiconductor light emitting element, to fabricate respective light emitting devices which can emit a white mixed color light, and the properties of the light emitting devices were evaluated. For the light emitting device, an LED to emit blue light having an emission peak wavelength of 455 nm and $Y_3(Al, Ga)_5O_{12}$:Ce are used in combination. The chromaticity (x, y) and the average color rendering index (Ra) of the light emitting devices are shown in Table 3. As shown in Table 3, the luminous flux value of Comparative Example 11 is set to 100% as reference, the luminous flux values of Examples 11 to 13 are 5.5% to 7.6% higher than the reference. As described above, with the use of a SCASN phosphor with a narrowed half width, an improvement of about 6% in the luminous flux of the light emitting device was confirmed to be obtained. In Examples 11 to 13, the Ra is equivalent to that of the comparative example or maintained somewhat higher, without compromising the color rendering properties. In this case, when the emission peak wavelength of the phosphor satisfies 610 nm≤λp≤625 nm, the half width is preferably 79 nm or less. More preferably, when the emission peak wavelength satisfies 625 nm<λp≤635 nm, the half width is preferably 90 nm or less.

(Emission Spectrum of Light Emitting Device)

Figure 8:
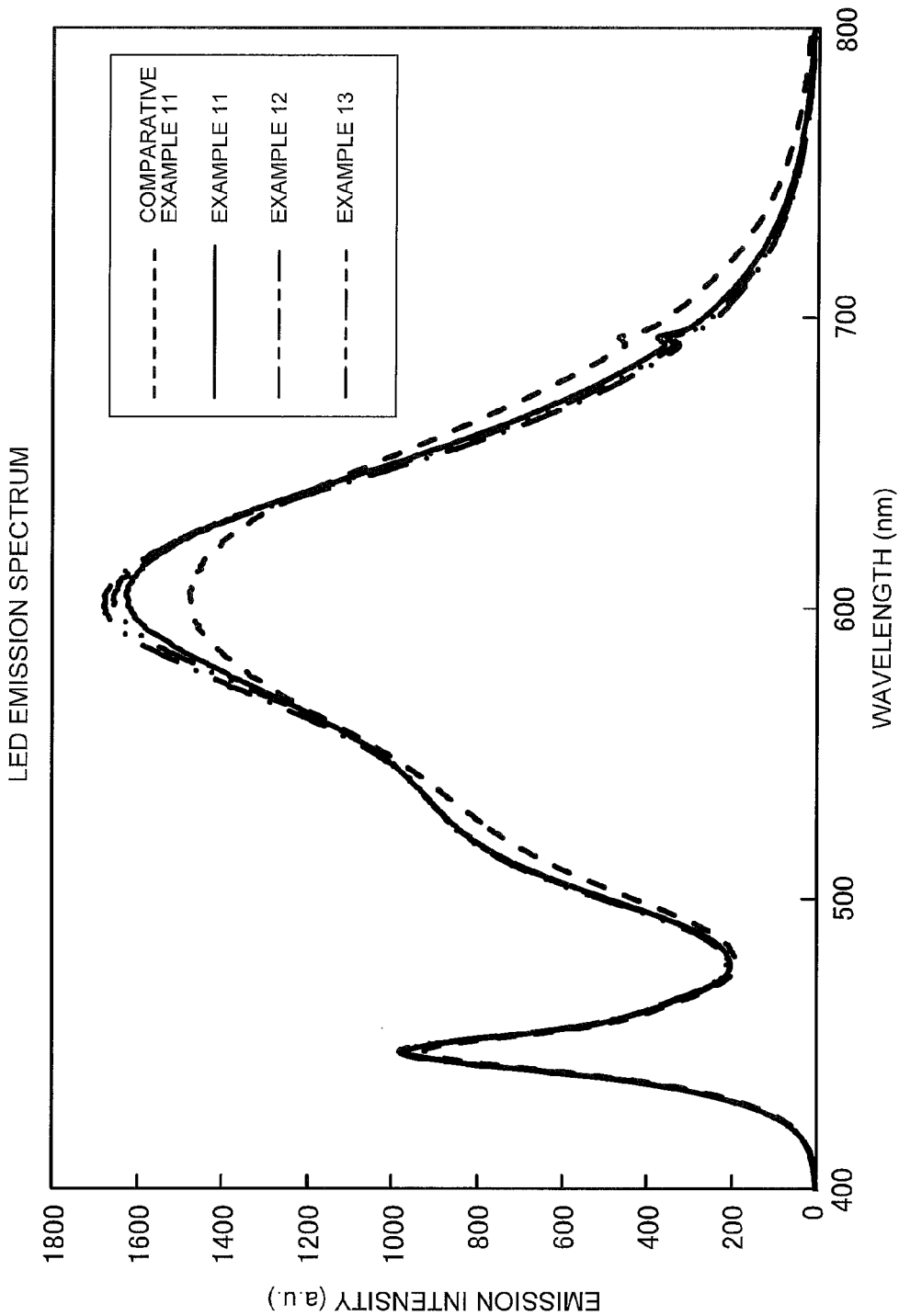
FIG. 8 is a graph showing emission spectra of light emitting devices according to Examples 11 to 13 and Comparative Example 11.
Figure 9:
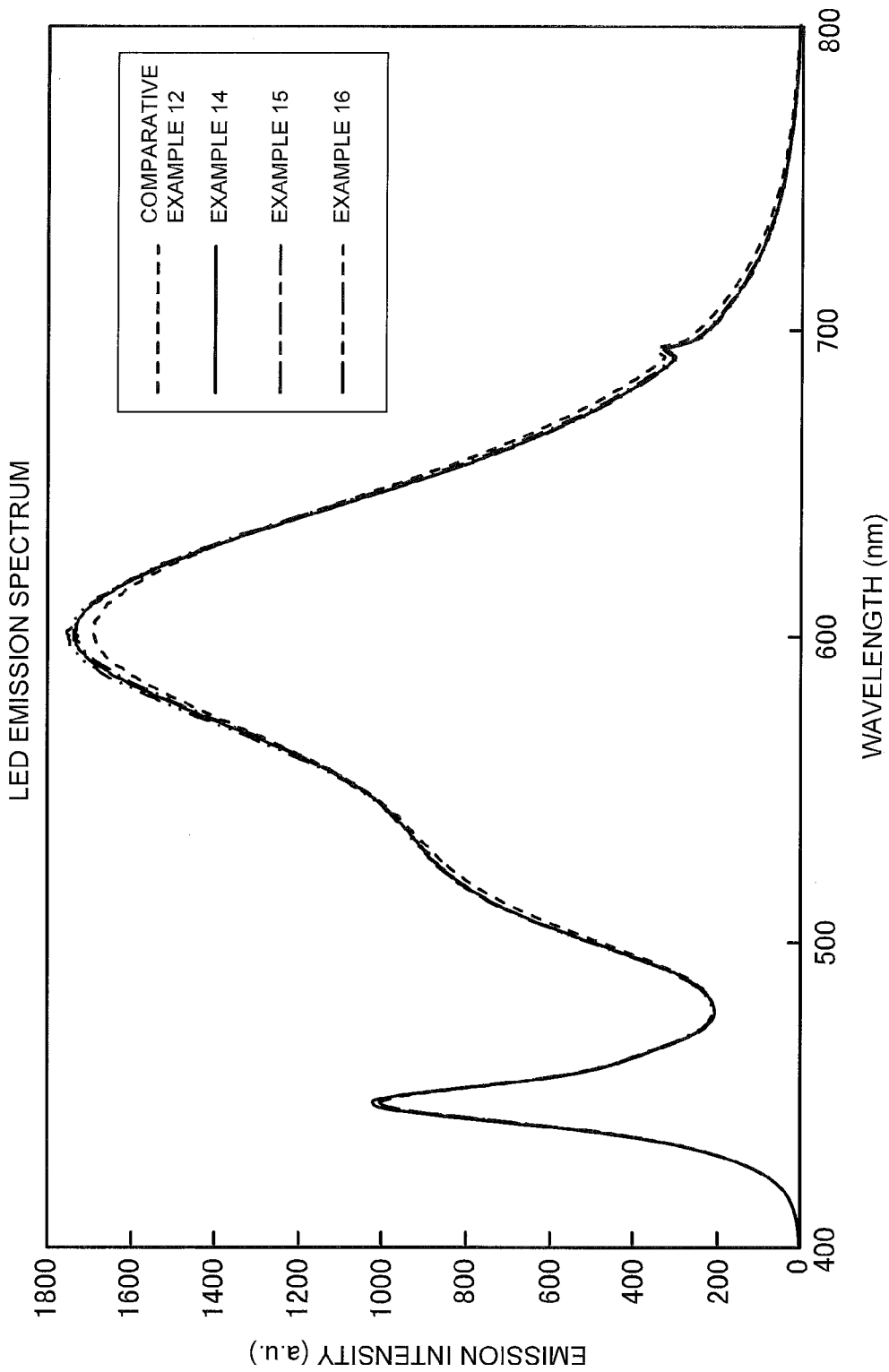
FIG. 9 is a graph showing emission spectra of light emitting devices according to Examples 14 to 16 and Comparative Example 12.

Next, the emission spectra of the light emitting devices according to Examples 11 to 13, and Comparative Example 11 are shown in FIG. 8, and the emission spectra of the light emitting devices according to Examples 14 and 15, and Comparative Example 11 are shown in FIG. 9, respectively. Also from those figures, a decrease mainly in the long-wavelength component with the use of phosphors according to the respective examples can be confirmed.

TABLE 3

| | Base Phosphor | Luminous Flux Ratio | x | y | Ra |
|---|---|---|---|---|---|
| Comparative Example 11 | Comparative Example 1 | 100.0 | 0.436 | 0.405 | 81.9 |
| Example 11 | Example 1 | 105.5 | 0.436 | 0.405 | 82.7 |
| Example 12 | Example 2 | 107.6 | 0.436 | 0.405 | 81.2 |
| Example 13 | Example 3 | 106.6 | 0.436 | 0.405 | 82.5 |
| Comparative Example 12 | Comparative Example 2 | 100.0 | 0.436 | 0.405 | 80.4 |
| Example 14 | Example 4 | 101.6 | 0.436 | 0.405 | 80.0 |
| Example 15 | Example 5 | 101.5 | 0.436 | 0.405 | 80.6 |
| Example 16 | Example 6 | 102.4 | 0.436 | 0.406 | 79.8 |

Examples 17-20, Comparative Examples 13-16

In the examples shown above, a case in which one kind of phosphor is combined with an LED to obtain a light emitting device is illustrated, but the present embodiment of the disclosure is not limited thereto, two or more kinds of phosphors can be combined with the LED. In such a case, a first phosphor having a first emission spectrum and a second phosphor having a second emission spectrum which is different from that of the first emission spectrum is preferably combined. With this arrangement, a light emitting device of high flux can be obtained.

Such examples are made as Examples 17 to 20, and the luminous flux ratio, the chromaticity, and the average color rendering index were measured, and the results are shown in Table 4. The emission spectrum of each of the light emitting device is shown in FIG. 10 to FIG. 13 respectively. In the examples, as the second phosphor to be combined, the phosphors to emit green light: $Ca_8MgSi_4O_{16}Cl_2$:Eu (Example 17), $(Sr,Ba)_2SiO_4$:Eu (Example 18), $Si_{5.8}Al_{0.2}O_{0.2}N_{7.8}$:Eu (Example 19), and $Lu_3Al_5O_{12}$:Ce (Example 20) were used and the light emitting devices which can emit mixed-color light of white light were fabricated.

Also, as the comparative examples, phosphors combined with the phosphor of Comparative Example 1 were made as Comparative Examples 13 to 16, and the properties of those were measured in a similar manner, and compared.

Figure 10:
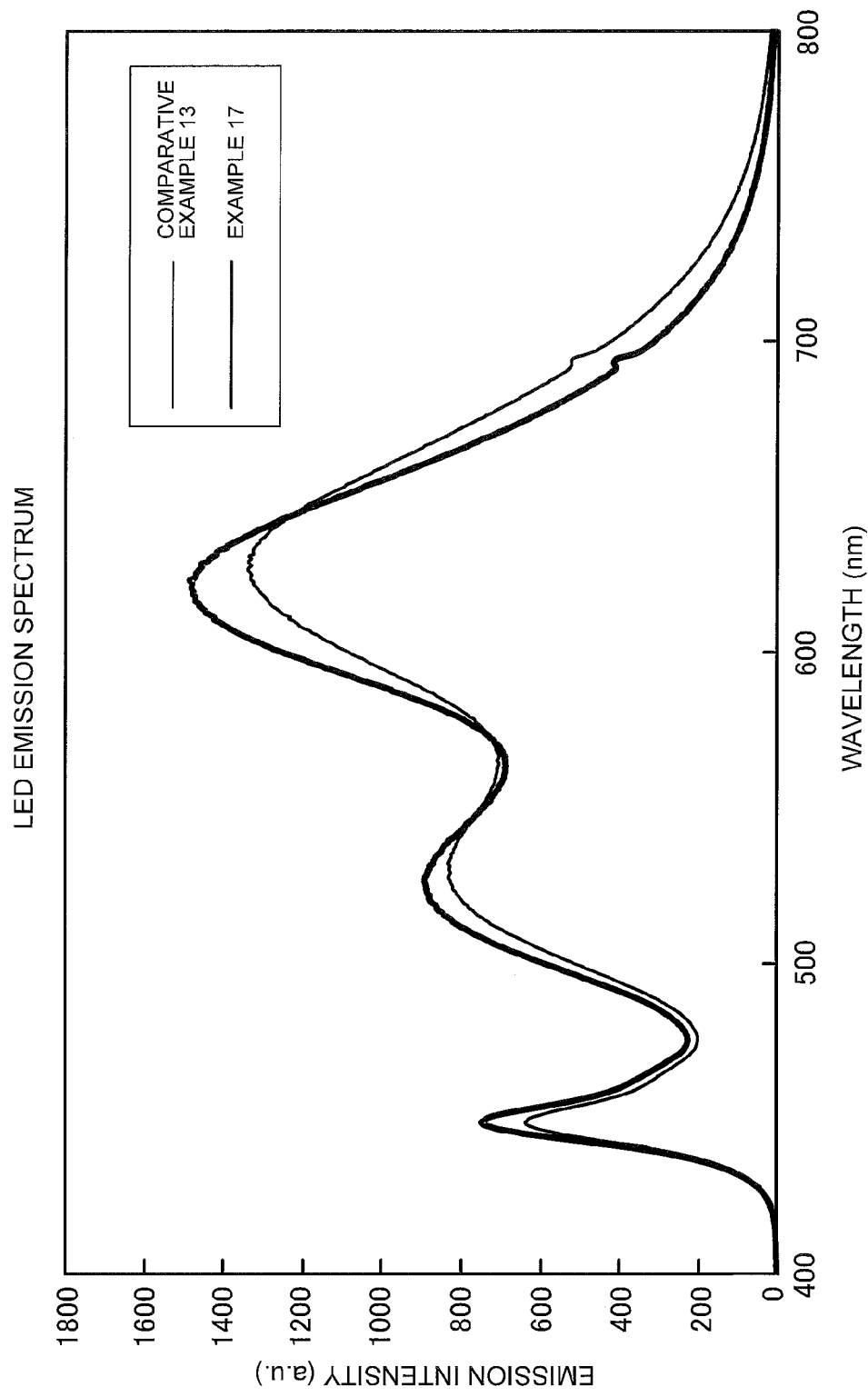
FIG. 10 is a graph showing emission spectra of light emitting devices according to Example 17 and Comparative Example 13.
Figure 11:
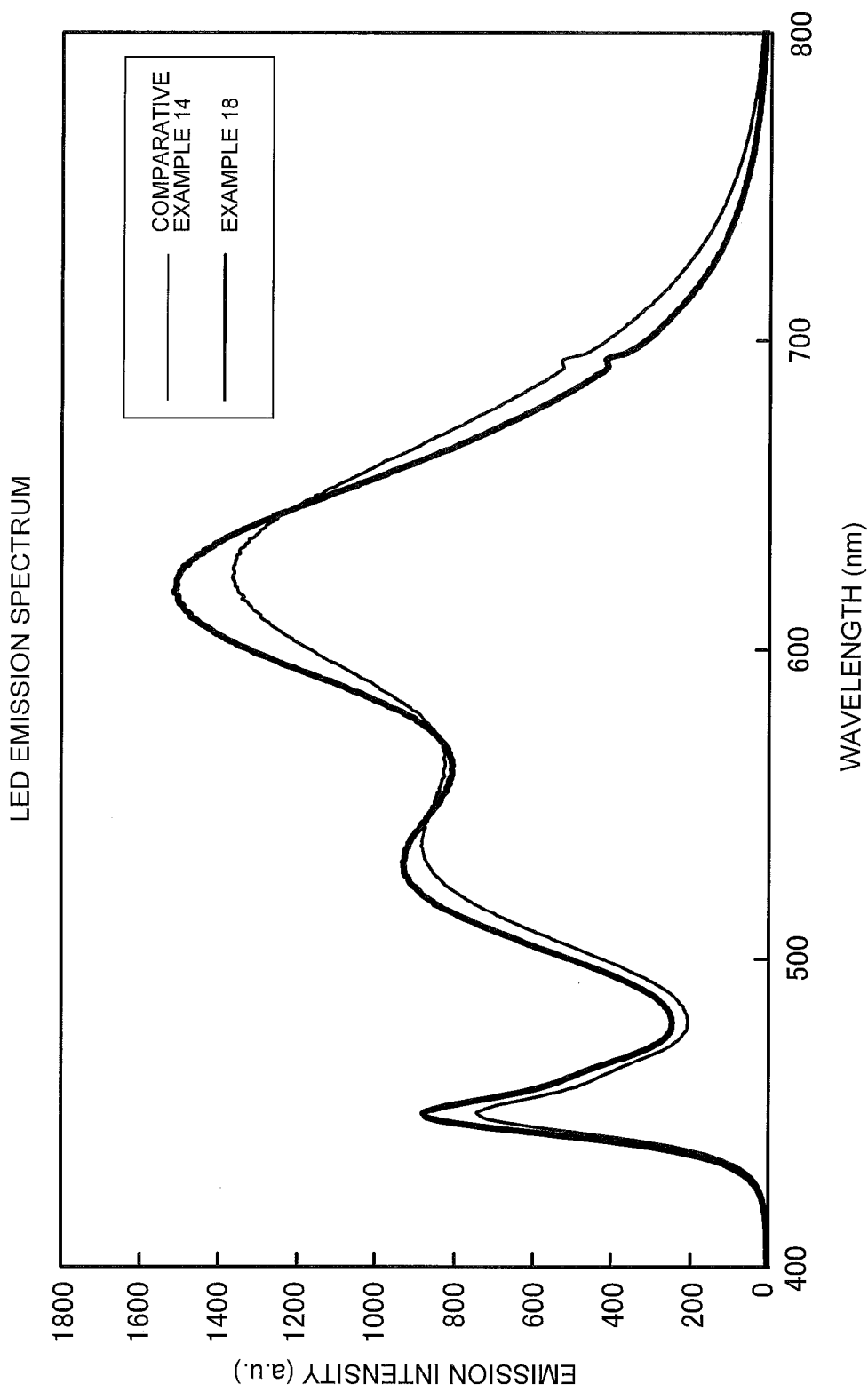
FIG. 11 is a graph showing emission spectra of light emitting devices according to Example 18 and Comparative Example 14.
Figure 12:
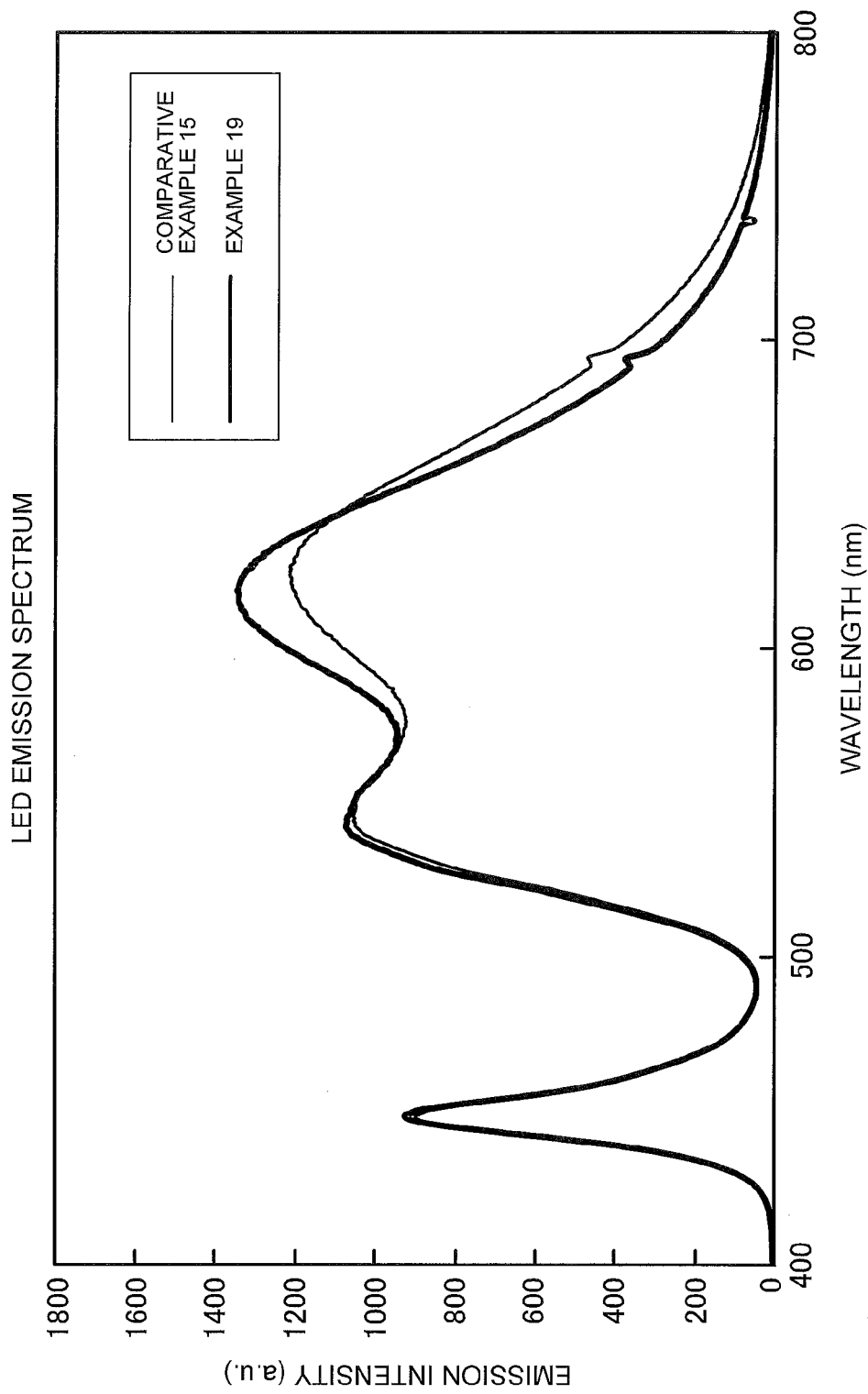
FIG. 12 is a graph showing emission spectra of light emitting devices according to Example 19 and Comparative Example 15.
Figure 13:
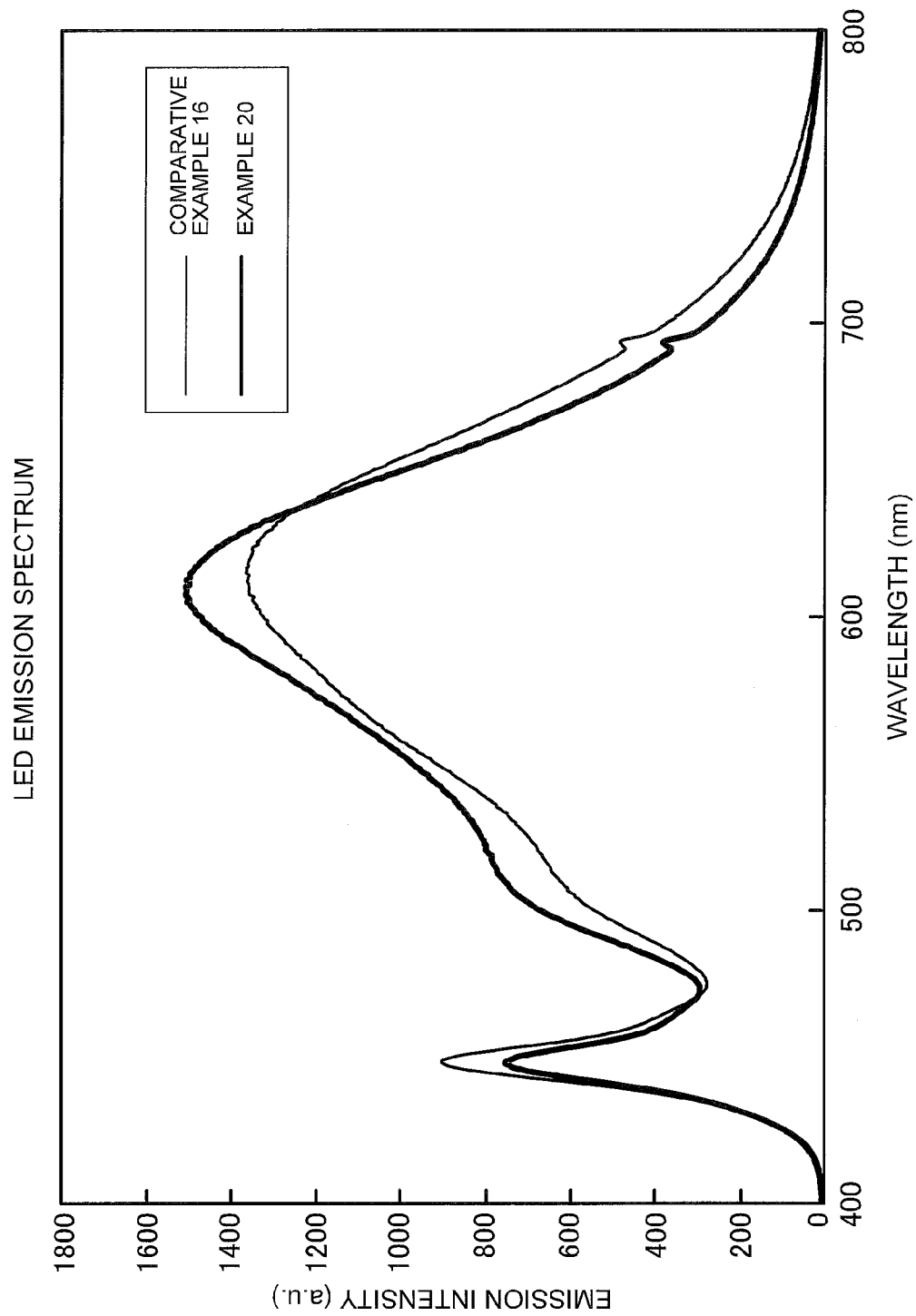
FIG. 13 is a graph showing emission spectra of light emitting devices according to Example 20 and Comparative Example 16.
Figure 14:
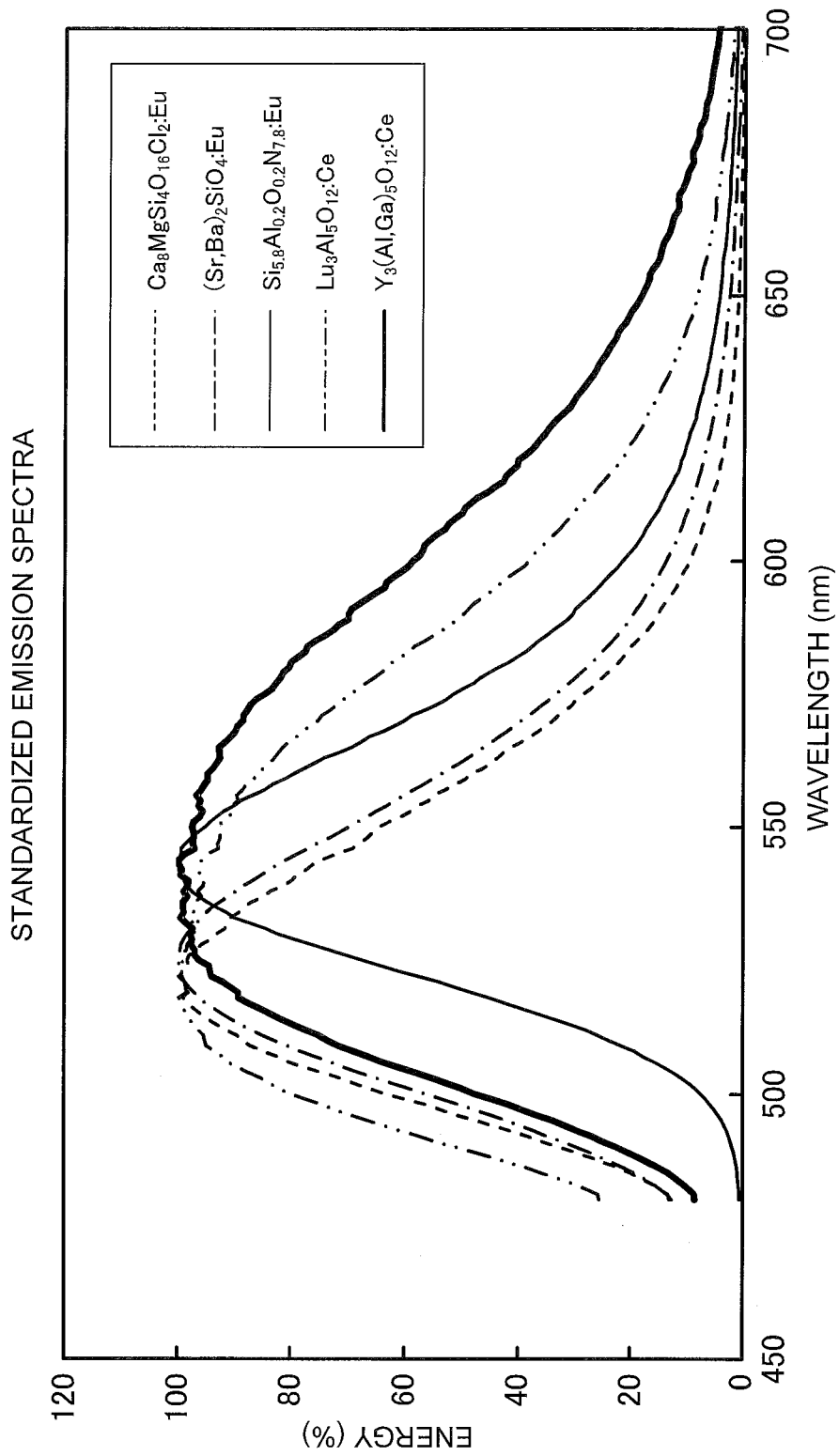
FIG. 14 is a graph showing emission spectrum of green phosphors according to Examples 11 to 20 and Comparative Examples 11 to 16.

FIG. 10 shows the emission spectra of the light emitting devices according to Example 17 and Comparative Example 13, FIG. 11 shows that of Example 18 and Comparative Example 14, FIG. 12 shows that of Example 19 and Comparative Example 15, FIG. 13 shows that of Example 20 and Comparative Example 16, and FIG. 14 shows the emission spectra of green phosphors used in Examples 11 to 20 and Comparative Examples 11 to 16, respectively.

As shown in those results, the light emitting devices which employ the phosphors according to respective examples of the present disclosure are confirmed to exhibit high luminous flux ratio. Further, it is not limited to a combination of two kinds of phosphors, three or more kinds of phosphors can be combined to further improve the luminous flux. Particularly it is though that, in the color rendering properties, basically, a reduction in a red component resulting in a reduction in the color rendering index (Ra), but in some examples, inversely, the Ra seems tend to increase. Ra is obtained by calculating a difference between the color rendering of a light source and that of a standard light at respective color temperatures. As described above, a reduction in the reflectance of the phosphor at about 550 nm, in other words, an increase of light-absorbing component, resulted in creation of a dent at about 550 nm in the emission spectrum of the light emitting device, which is thought to affect the Ra. Even with a slight reduction in the color rendering properties, a higher luminous flux is achieved, so that a large effect can be exhibited.

TABLE 4

| | Base Phosphor | Phosphor used in combination | Luminous Flux Ratio | x | y | Ra |
|---|---|---|---|---|---|---|
| Comparative Example 13 | Comparative Example 1 | $Ca_8MgSi_4O_{16}Cl_2$:Eu | 100.0 | 0.436 | 0.411 | 93.9 |
| Example 17 | Example 1 | | 106.1 | 0.435 | 0.403 | 92.3 |
| Comparative Example 14 | Comparative Example 1 | $(Sr,Ba)_2SiO_4$:Eu | 100.0 | 0.435 | 0.409 | 95.9 |
| Example 18 | Example 1 | | 106.9 | 0.431 | 0.399 | 94.9 |
| Comparative Example 15 | Comparative Example 1 | $Si_{5.8}Al_{0.2}O_{0.2}N_{7.8}$:Eu | 100.0 | 0.436 | 0.407 | 79.5 |
| Example 19 | Example 1 | | 104.7 | 0.440 | 0.406 | 80.3 |
| Comparative Example 16 | Comparative Example 1 | $Lu_3Al_5O_{12}$:Ce | 100.0 | 0.427 | 0.395 | 88.7 |
| Example 20 | Example 1 | | 108.0 | 0.432 | 0.410 | 88.5 |

As described above, with the phosphors according to the examples, the half value width of the emission spectrum can be reduced by controlling the half value width of the emission spectrum, in particular, by reducing a component on the long wavelength side. With the use of the phosphor, a light emitting device in which visibility components are increased and a high luminous flux can be realized without compromising the color reproduction range and the color rendering properties.

Particularly, variation or adjustment of the half width with the composition of the conventional phosphors (for example, see the above cited documents) has never been examined. On the other hand, in an embodiment of the present disclosure, the relationship between the composition and the emission spectrum of a phosphor is considered in detail, and succeeded in increasing the luminosity efficiency factor and increasing the luminance of the SCASN phosphor.

The phosphor and a light emitting device using the same, and a method of manufacturing the phosphor according to the present disclosure can be suitably applied to a light source for lighting or the like. Particularly, suitably applied for a light source for lighting, an LED display, a backlight light source, signals, a lighted switch, various sensors, various indicators, or the like, those have excellent light emitting properties with an excitation light source of a blue light-emitting diode or an ultraviolet emitting diode.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

This application claims priority to Japanese Patent Application No. 2014-014958 filed on Jan. 29, 2014 and No. 2015-012038 filed on Jan. 26, 2015. The entire disclosures of Japanese Patent Application No. 2014-014958 and No. 2015-012038 are hereby incorporated herein by references.

What is claimed is:

1. A phosphor for absorbing light in a region from ultraviolet to visible light and emitting light whose emission peak wavelength being in a range of 600 nm to 650 nm, wherein a general formula is:

$Sr_tCa_vEu_wAl_xSi_yN_z$ (wherein $0.5 \leq t < 1$, $0 < v \leq 0.5$, $0.01 < w \leq 0.03$, $t+v+w<1$, $0.90 \leq x \leq 1.1$, $0.90 \leq y \leq 1.1$, $2.5 \leq z \leq 3.5$);
wherein a difference between the emission peak wavelength and a half width is larger than 543 nm, and wherein a reflectance to light with a wavelength of 550 nm is 15% to 28%.

2. The phosphor according to claim 1, wherein an average particle size is 5 μm to 20 μm.

3. The phosphor according to claim 1, wherein an oxygen content in the phosphor is 0.5 weight percent to 2.0 weight percent.

4. The phosphor according to claim 1, wherein a difference between the emission peak wavelength and a half width is smaller than 640 nm.

5. The phosphor according to claim 1, wherein the half width is 79 nm or less at the emission peak wavelength of 610 nm to 625 nm.

6. The phosphor according to claim 1, wherein the half width is 90 nm or less at the emission peak wavelength of 625 nm to 635 nm.

7. A light emitting device comprising:
the phosphor according to claim 1; and
an excitation light source to emit light in a range from ultraviolet light to visible light.

8. The light emitting device according to claim 7, wherein the excitation light source has a peak wavelength of 430 nm to 470 nm.

9. The light emitting device according to claim 7 further comprising at least one second phosphor selected from the group consisting of $(Y, Gd, Tb, Lu)_3(Al, Ga)_5O_{12}:Ce$, $(Ca, Sr)_8MgSi_4O_{16}Cl_2:Eu$.

10. The phosphor according to claim 1, wherein $0.015 < w \leq 0.03$.

* * * * *